(12) United States Patent
Nakano (10) Patent No.: US 10,637,361 B2
(45) Date of Patent: Apr. 28, 2020

(54) POWER CONTROL MODULE WITH IMPROVED START REQUIREMENTS

(71) Applicant: SANKEN ELECTRIC CO., LTD., Niiza-Shi, Saitama (JP)

(72) Inventor: Toshihiro Nakano, Niiza (JP)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 39 days.

(21) Appl. No.: 15/881,878

(22) Filed: Jan. 29, 2018

(65) Prior Publication Data

US 2018/0152110 A1 May 31, 2018

Related U.S. Application Data

(63) Continuation of application No. 14/734,576, filed on Jun. 9, 2015.

(51) Int. Cl.
*H02M 3/335* (2006.01)
*H02M 1/36* (2007.01)
*H02M 1/42* (2007.01)
*H02M 1/00* (2006.01)

(52) U.S. Cl.
CPC ........ *H02M 3/33546* (2013.01); *H02M 1/36* (2013.01); *H02M 1/4225* (2013.01); *H02M 3/33507* (2013.01); *H02M 2001/0006* (2013.01); *H03K 2217/0036* (2013.01); *Y02B 70/126* (2013.01); *Y02B 70/1433* (2013.01)

(58) Field of Classification Search
None
See application file for complete search history.

(56) References Cited

U.S. PATENT DOCUMENTS

| 8,866,401 B2* | 10/2014 | Shearer | H05B 37/0263 |
| | | | 315/246 |
| 8,928,236 B1* | 1/2015 | Mays, II | H05B 33/0848 |
| | | | 315/200 R |
| 2005/0212501 A1* | 9/2005 | Acatrinei | G05F 1/70 |
| | | | 323/283 |
| 2010/0315017 A1* | 12/2010 | Yu | H02M 1/36 |
| | | | 315/291 |
| 2015/0054417 A1* | 2/2015 | Lee | H05B 37/0272 |
| | | | 315/201 |
| 2015/0244248 A1* | 8/2015 | Knoedgen | H05B 33/0815 |
| | | | 315/223 |
| 2016/0065075 A1* | 3/2016 | Sugahara | H02M 1/4225 |
| | | | 363/21.02 |
| 2016/0087524 A1* | 3/2016 | Simi | H05B 33/0887 |
| | | | 323/205 |

FOREIGN PATENT DOCUMENTS

| CN | 101136593 A | 3/2008 |
| CN | 201726182 U | 1/2011 |

* cited by examiner

*Primary Examiner* — Jue Zhang
*Assistant Examiner* — Henry E Lee, III
(74) *Attorney, Agent, or Firm* — Metrolex IP Law Group, PLLC (57) ABSTRACT

Circuits and devices are described that provide power to appliances and other devices via a power correction circuit and an LLC converter, which may for example include resonant series converters and flyback converters. The circuits and devices economize on board space, part size and power start up time by separately powering up the controller circuit portion prior to powering up the LLC converter.

18 Claims, 9 Drawing Sheets

POWER MANAGEMENT MULTI-CHIP MODULE IN A
CEILING FAN CONTROL APPLICATION

Fig. 1
Prior Art

DETAIL OF ONE LOW-SIDE DRIVER AND ONE HIGH-SIDE
DRIVER OF THE FIRST DIE

Prior Art

POWER CONTROL MODULE WITH IMPROVED START REQUIREMENTS

CROSS REFERENCE TO RELATED APPLICATION

This application is a continuation of application Ser. No. 14/734,576, filed on Jun. 9, 2015, the entire contents of which are incorporated herein by reference.

FIELD

Embodiments relate to power control circuits, particularly for appliances.

BACKGROUND

Figure 1:
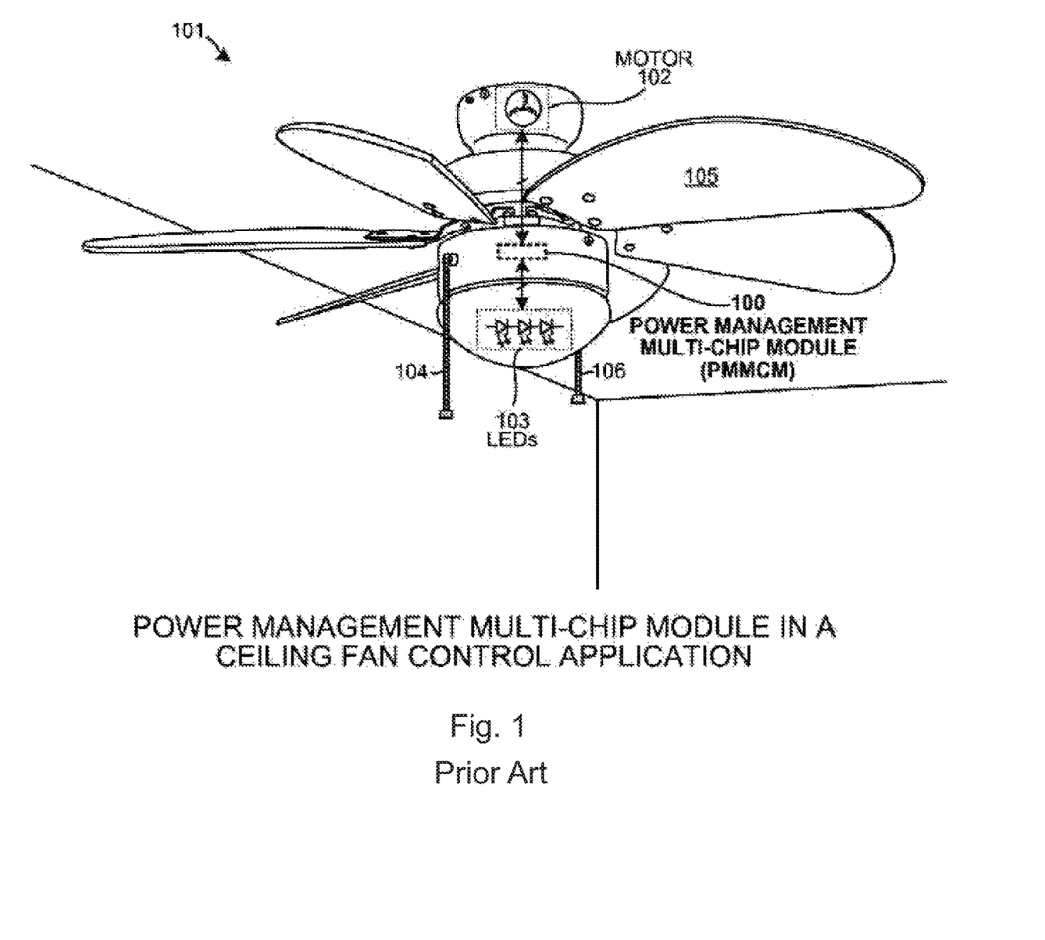
FIG. 1 shows a prior art power management multi-chip module in an embodiment of controlling a ceiling fan.

Modern appliances such as electric fans, other AC motors, LEDs, and other DC powered devices work best when supply power is controlled to optimize parameters such as power factor, phase differences and voltage differences. See for example U.S. No. 20140125266 (Huynh et al.), which teaches a processor-controlled high and low side driver circuitry such as for driving inductive loads. Huynh discloses a combination of low and high voltage dies in a power management multi-chip module (PMMCM) containing two dies for driving a fan, as shown in FIG. 1 which is a reproduction of Huynh's FIG. 2 used for explaining this prior art reference.

One die contains a pulse-width modulator (PWM) and other components that include low-side drivers. The second die contains the ultra-high voltage high-side drivers that supply drive signals to the external high-side transistors. External low-side transistors are driven directly by low-side drivers of the first die. For example FIG. 2, which is the prior art of Huynh's FIG. 5, shows a circuit diagram of one low-side driver 233, and one high-side driver 236 of the power management integrated circuit (PMIC) die 108. Low-side driver 233, coupled to a +12 volt supply voltage VP, controls external discrete NFET 260 via terminal LS1 264. High-side driver 236, also coupled to a +12 volt supply voltage VP, has P-channel and N-channel FETs 323 and 324 that are interconnected as a complementary logic inverter that supplies an output to the gate of external discrete NFET 272.

Figure 2:
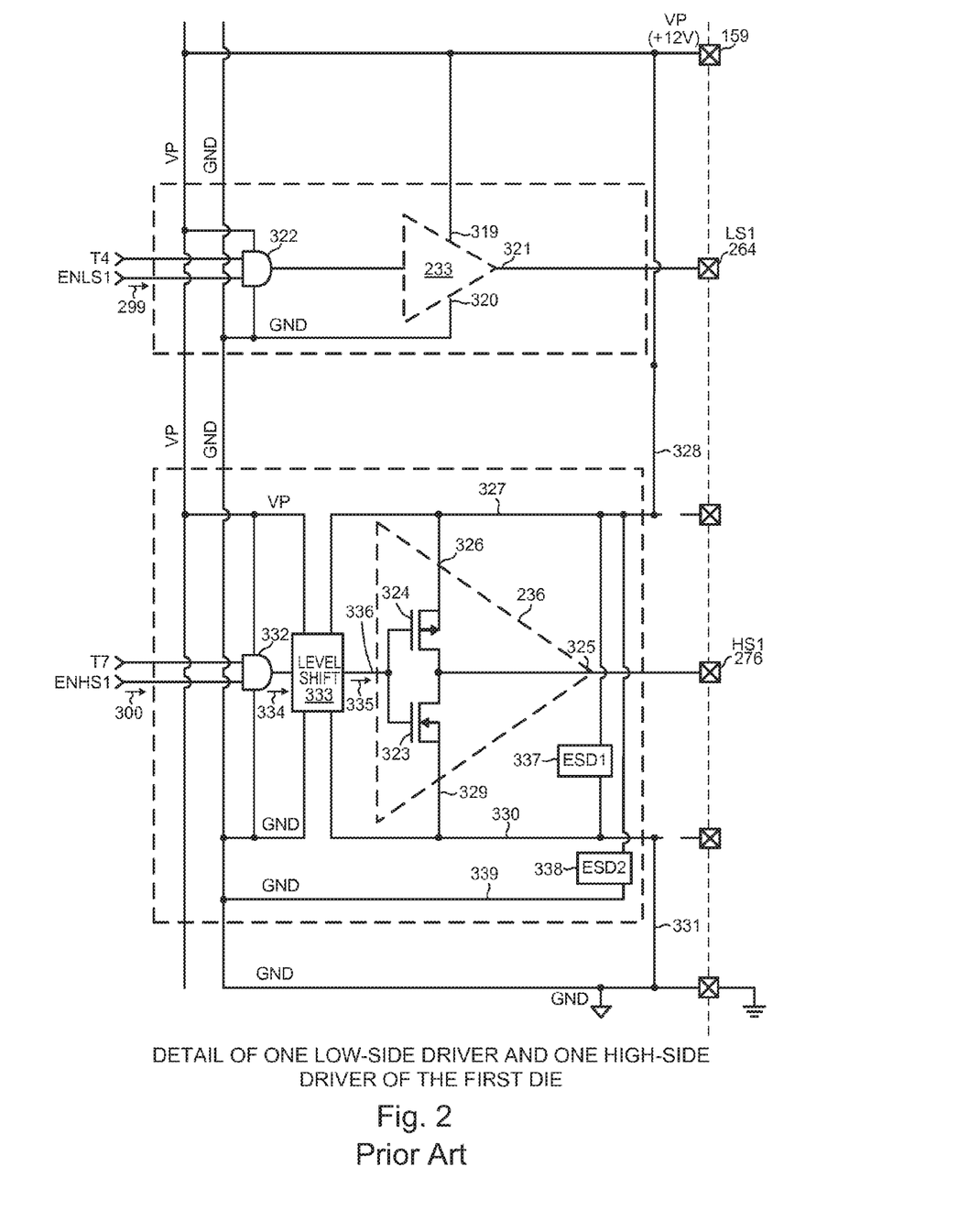
FIG. 2 in further showing the prior art of FIG. 1 presents a circuit diagram of one low side driver and one high side driver of the Power Management Integrated Circuit (PMIC) die.

Block 332 is digital logic that supplies a control signal to turn on and off the external discrete NFET 272. Block 333 is a level shift circuit that receives the digital logic control signal and shifts the signal so that it is output as a digital logic control signal 335 onto input lead 336 of high-side driver 236.

Such power modules benefit from component selection and circuit optimization for lowered manufacturing complexity/costs and higher power consumption efficiency.

Power control circuits that run such appliances typically contain a microprocessor that has to be powered up upon turning on the appliance. To achieve this, normally an alternating power high voltage is rectified and a low voltage applied to a Vcc power pin in series with a start resistor and in parallel with a capacitor. The microprocessor in turn often generates a reference voltage such as 5.0 volts for use in associated control circuitry. Outside the microprocessor is typically found a voltage or current regulator necessary to operate the microprocessor within a suitable voltage range.

Further regarding PFC circuits, the use of a MOSFET as the switch component in the PFC gives a turn-on that can be at a low voltage, which favorably reduces PFC switching losses. The PFC typically can operate in a current-mode control or a voltage-mode control. A boost converter is often used in PFC circuits that can operate in different modes, such as a continuous conduction mode (CCM), a discontinuous conduction mode (DCM), and a critical conduction (or boundary or borderline conduction) mode (CrM or BCM).

The fundamental states of operation (power switch ON and power switch OFF) can be demonstrated by considering, for example, the CrM PFC converter operating mode, with a diode bridge output to a parallel capacitance and series inductance. When the power switch is turned on, this circuit produces a linearly rise or increase in the coil current, Icoil. When turned off, this produces a linearly decrease in the coil current Icoil. The resulting current waveform in the two operating states in a critical mode conduction PFC shows a coil current peak. At another point, the core is reset. This relationship between when the reset occurs is the basis of the voltage-mode control of the PFC converter operating in the critical conduction mode, CrM A problem of power control circuits arises when a microprocessor needs initial power supplied via a Vcc pin in parallel with a capacitor, and when other circuits also need typically higher power to start. When all circuits start at the same time, the microprocessor cannot begin to work until a later time when a suitably high voltage is obtained. This delays overall circuit operation because the microprocessor has to regulate and control the other circuits, while at the same time waiting to start control while the other circuits are competing for power up current. The additional power demands put pressure on designing a larger Vcc capacitor, with commensurate decrease in board space, increased cost and increased start up time needed to charge up the 3 capacitor to a suitable voltage.

Figure 3:
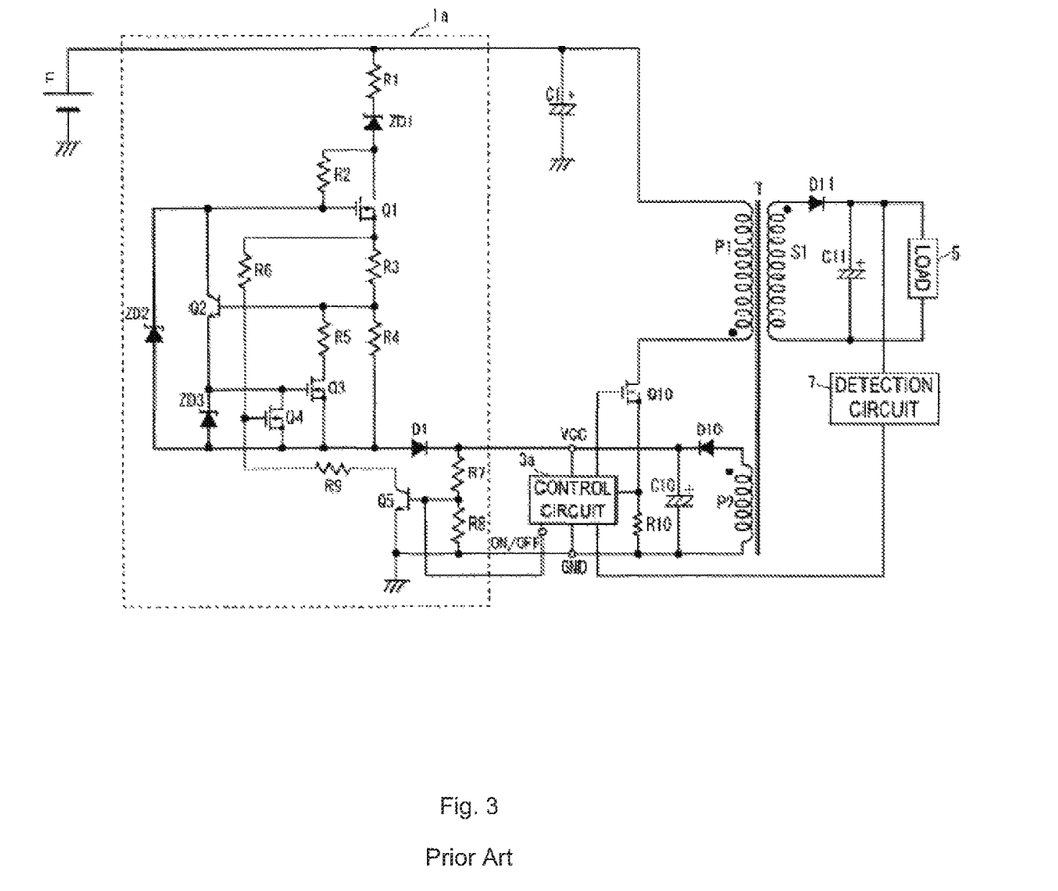
FIG. 3 is a switching power supply apparatus circuit of the prior art for performing power in which a starting circuit of supplying a starting current to a control circuit controlling a switching operation includes a constant current circuit.

An example of circuits used in this field is shown in U.S. No. 20140177284 (Nakano). FIG. 3 is a copy of Nakano's FIG. 1 for explaining this circuit. FIG. 3 summarizes how this reference teaches the use of a constant current limited circuit needed between a rectified power supply and a microprocessor power input. FIG. 3 is a switching power supply apparatus circuit and the broken line shows a start circuit. The circuit has a capacitor C1, a starting circuit 1a, and a transformer T with primary, secondary and tertiary windings P1, S1, P2 respectively, a MOSFET switching element Q10. Resistor R10 detects the current flowing through switching element Q10 and a control circuit 3 controls the on-off switching of Q10. Capacitors C10, C11 and diodes D10, D11 make up rectifying and smoothing circuits. In some cases an analog power supply IC is used for power in the start up circuit, which adds further expense and complexity. Accordingly one problem in this field is the need for a more efficient start up power system that can minimize board space, cost, complexity and start up time.

SUMMARY OF THE INVENTION

The limitations in the art described above are alleviated by embodiments. One such embodiment is a power control device for an external circuit comprising a control unit including a microprocessor, a drive unit connected to the control unit that receives a signal from the control circuit and supplies a drive signal to an external circuit, and a startup circuit that generates a drive power supply and provides current to the controller and the drive unit based on the drive power supply, wherein the startup circuit changes the current based on the signal from the controller.

Another embodiment is a power control device as above, wherein the external circuit comprises a PFC comprising at least one switching circuit for converting the input voltage to an intermediate voltage, and a DC-DC converter comprising at least one switching circuit, that converts the intermediate voltage to an output voltage, wherein the power control unit obtains power from the input voltage and an output voltage of the DC-DC converter. In an embodiment, the power control device operates such that upon application of power to the power control device, the power control device drives the external PFC, and then drives the DC-DC converter. In another embodiment, the drive unit comprises a driver PFC that supplies a drive signal to the PFC, and a driver DD that supplies a driver signal to the DC-DC converter.

In yet another embodiment, in a power control device as described above, the startup circuit converts an input voltage to the drive power supply voltage and outputs power to the controller when the driving power supply voltage is lower than a predetermined voltage, and the startup circuit stops converting from the input voltage to the drive power voltage when the drive power supply voltage is higher than a predetermined voltage. In an embodiment the power control device comprises a first mode for supplying a first current of the power supply voltage to the control unit and a second mode for supplying a second current that is greater than the first current to the control unit based on the drive power supply voltage. In an embodiment when in the first mode, supply of the first current is restricted for at least a part of a system processing unit. In yet another embodiment, the control unit comprises a PWM PFC that supplies a PFC drive signal to the driver PFC, and a PWM DD that supplies a DD drive signal to the driver DD. In an embodiment the power control device further comprises a third mode for stopping the current supply to the controller.

In an embodiment of a power control device as described above, the control unit obtains the drive power supply voltage based on an external circuit. In an embodiment the power control device further comprises a detector that detects the drive power supply voltage, and switches the current supplied to the controller and the control unit based on the drive power supply voltage. Furthermore, in another embodiment, the detector switches the current supplied to the controller and the control unit based on an output of an external circuit. In an embodiment the power control device further comprises a timer that switches the current supplied to the controller and the control unit based on the drive power supply voltage at a predetermined time.

An embodiment is a three circuit apparatus with sequential power up capability, comprising a first control circuit comprising a microprocessor, a driver with a power input and one or more outputs to a PFC, a second circuit comprising a PFC with a power input and a power output, and a third circuit comprising a DC-DC converter with a power input and a power output, wherein upon application of external power to the apparatus, a first voltage increase occurs at the power input of the first circuit via a temporary connection to the external power, and then a second voltage increase occurs at the power output of the second circuit, and then a third voltage increases at the power output of the third circuit. In an embodiment the first circuit comprises a startup circuit that comprises a constant current regulator and is turned off upon detection of sufficient power or voltage in the third circuit. In another embodiment the second circuit power output increases in response to a sensed increase in the first circuit power or voltage input. In yet another embodiment, the third circuit power output increases in response to a sensed increase in the second circuit power or voltage input. In yet another embodiment the microprocessor monitors the voltage of the first circuit input by repeated sampling of the voltage and triggers an increase in the second circuit output in response to a sensed increase in sampled voltage. In another embodiment the first and second circuits are formed on a common semiconductor substrate and the third circuit is a higher voltage circuit that is formed on a separate semiconductor substrate.

In an embodiment the second circuit power input increases in response to a sensed increase in the first circuit power or voltage input. In another embodiment the third circuit power input increases in response to a sensed increase in the second circuit power or voltage input.

Another embodiment is an appliance comprising the three circuit apparatus, wherein the LLC provides at least part of the power to the appliance. In another embodiment a high voltage motorized appliance comprises the three circuit apparatus, wherein the LLC provides high voltage to one or more motor windings.

Other embodiments, including combinations of the above, readily will be appreciated by a skilled artisan.

BRIEF DESCRIPTION OF THE DRAWINGS

FIG. 4 is a circuit that produces a linear rise or increase in the coil current Icoil, when the power switch is ON.

DETAILED DESCRIPTION

In embodiments, microprocessor controlled appliances utilize modified power from a power source wherein a startup circuit works with a controller section, an optional driver section, a power factor correction (PFC) and a DC to DC converter for sequential powering.

Figure 7:
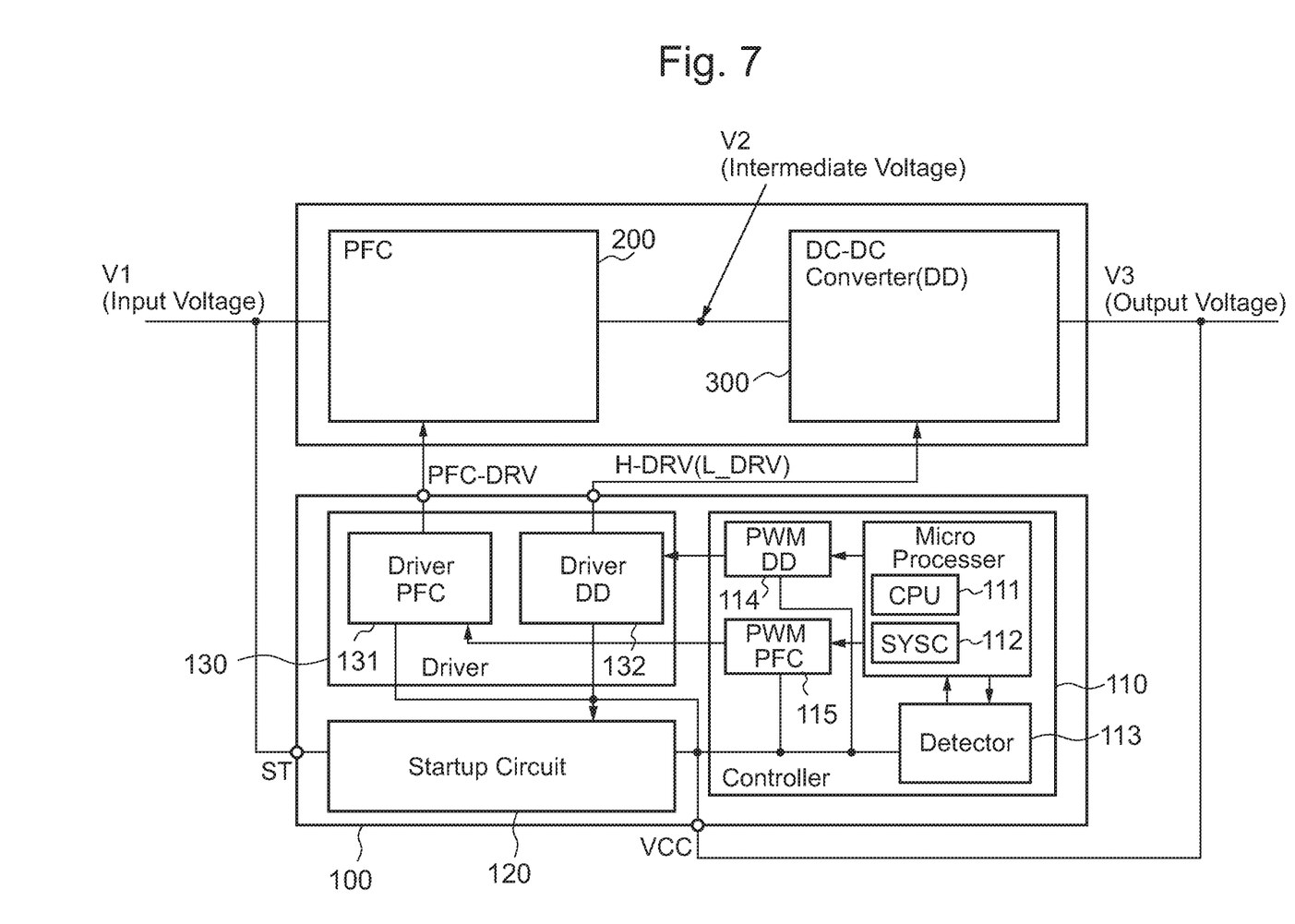
FIG. 7 is a block diagram of a desirable power source embodiment.

FIG. 7 shows an embodiment wherein a startup circuit 120 is located between an input voltage V1 and controller 110. Controller section 110 can output control signals directly to a PFC or DC to DC converter ("DD") in embodiments, and many embodiments utilize an intermediary driver section shown as 130 in this figure. The optional driver section 130 typically has high voltage driver PFC and driver DD 132. The PFC is controlled by connection to the driver section, (or directly to controller in some embodiments). The PFC and DD are connected together via an intermediate voltage obtained from the PFC.

Item 100 is a control module that comprises a microprocessor or other control chip as a CPU, and optional driver 130 and startup circuit 120. Power control circuit interacts with second circuit 200 labeled as PFC and with third circuit 300 "LLC" labeled as DC-DC converter ("DD").

Power Factor

A power factor correction (PFC) circuit shapes the input current of off-line power supplies to maximize the real power available from the main power supply. For optimum performance, an electrical appliance should present a purely resistive load with no reactive component. In other words, the appliance should draw zero reactive power. The ideal world also has the current in phase with the voltage, such as a sine wave voltage. Further, there would be no input current harmonics so that the current is a perfect replica of the voltage.

Power factor is calculated as real power (watts) divided by apparent power (in VA). A power factor of 1.0 occurs when the current and voltage are both in-phase, sine waves. If they are not in phase, the power factor is the cosine of the phase angle.

A PFC circuit is employed in power supplies to correct these various factors to bring them as close as possible to the theoretical, ideal situation. Another reason for use of PFC circuits in power supplies is to comply with appropriate standards and regulatory requirements. For example, a regulatory requirement known as IEC61000-3-2 sets forth compliance requirements for electrical equipment in Europe and Japan, and applies to appliances with an input power above 75 watts. Energy Star certifications often carry a PFC requirement as well.

In operation, input voltage V1 is power factor converted into an intermediate voltage V2 that feeds the DC to DC converter, which outputs output voltage V3. Output voltage V3 goes to a power consuming device such as an appliance. The controller section optionally has detector 113 that feeds signals to a microprocessor, which in turn controls the drivers. The startup circuit provides early power to the controller section in a sequenced manner as described below.

Further regarding the PFC circuit, the use of a MOSFET as the switch component in the PFC gives a turn-on that can be at a low voltage, which favorably reduces PFC switching losses. The PFC can operate in a current-mode control or a voltage-mode control.

A boost converter is often used in PFC circuits that can operate in different modes, such as a continuous conduction mode (CCM), a discontinuous conduction mode (DCM), and a critical conduction (or boundary or borderline conduction) mode (CrM or BCM).

The fundamental states of operation (power switch ON and power switch OFF) can be demonstrated by considering, for example, the CrM PFC converter operating mode.

Figure 4:
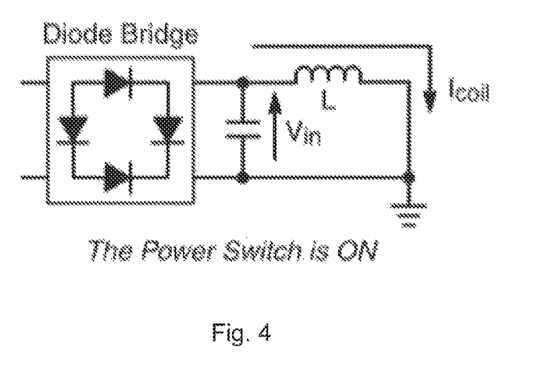

FIG. 4 is the basic circuit for when the power switch is ON, which produces a linearly rise or increase in the coil current, Icoil.

Figure 5:
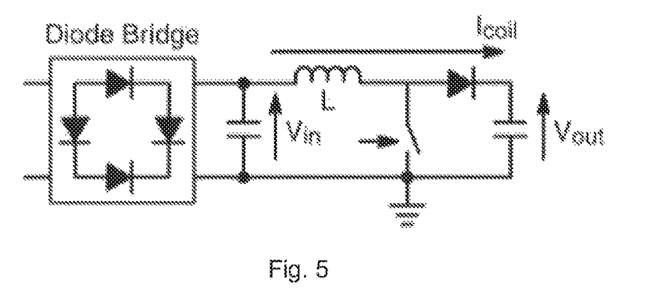
FIG. 5 is a circuit that produces a linear decrease in the coil current Icoil, when the power switch is OFF.

FIG. 5 is the basic circuit for when the power switch is OFF, which produces a linearly decrease in the coil current Icoil.

Figure 6:
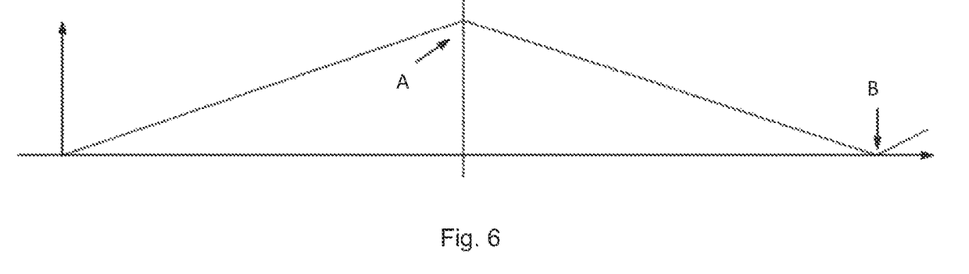
FIG. 6 is a resulting current waveform in the two operating states of FIGS. 4-5 in a critical mode conduction PFC.

The resulting current waveform in the two operating states in a critical mode conduction PFC shown in FIG. 6, "A" is where the coil current Icoil (y axis) is at its peak, or Icoil=Ipeak. Point "B" indicates when the nest cycle as the core is reset. This relationship of FIGS. 4, 5 and 6 illustrate one example of the basis of the voltage-mode control of the PFC converter, this example being for operation in the critical conduction mode, CrM.

The Controller Section

Figure 8:
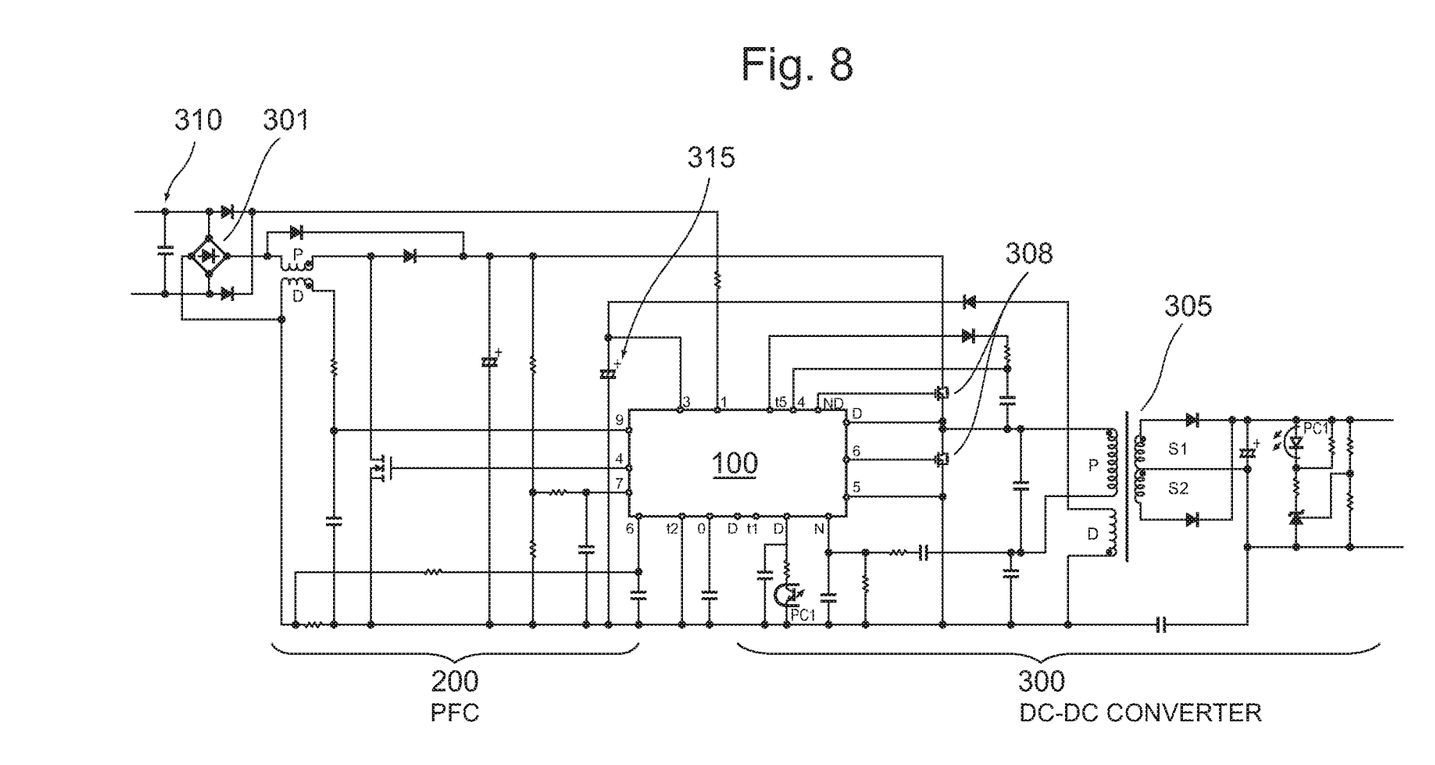
FIG. 8 is a representative circuit diagram of a power source.

The controller section responds to output voltage and other detected parameters via a detector and outputs control signals as for example pulse width modulation (PWM) control signals as exemplified in FIG. 7. A wide variety of controllers are useful in various embodiments. As shown in FIG. 8, a controller can be as simple as a programmable interface controller, microprocessor or any other kind of stored program executing circuit. In an embodiment the controller is pure hardware with functions carried out purely by circuitry. In a preferred embodiment a microprocessor is used having its own internal memory as shown in FIG. 8. In an embodiment, an external capacitor is used between Vcc of the microprocessor and ground that becomes charged to a predetermined voltage upon connection to a power supply.

In an embodiment, the controller comprises a constant current startup circuit that can limit the current flowing to charge the external capacitor connected to the Vcc terminal. At the time of startup, in an embodiment, the microprocessor may require tens of milliamps and preferably around 10 milliamps, although a wide variety of microprocessors now and in the future can require much less or much more than this depending on what type of technology they use and what they are driving. The controller section comprises at least one CPU such as a microchip or microprocessor. A wide variety of CPUs are available as a skilled artisan readily appreciates. Preferably a CPU is designed to handle signal inputs, signal comparison, higher level functions such as PWM generation with error feedback control and control signal output.

The detector may comprise one or more outboard components such as series resistors, Hall effect devices for detecting current, sample and hold detectors, resister bridges to sample voltage, instrumentation amplifiers, and the like. In an embodiment, the detector is made on the same substrate as the microprocessor or even may be part of the microprocessor. In an embodiment a PWM output is formed outside the CPU but in another embodiment the PWM output is from the CPU itself. The controller section preferably is low voltage and may for example be driven by 12 volts, 5 volts, or 3.3 volts. The controller carries out detection, processing of detected information such as output voltage, output current and the like, and outputs control signals.

The High Voltage Driver Section and Startup Circuit

The optional driver section and the startup circuit, in contrast preferably are high voltage and may be located on a separate die. The driver section receives control signals from the controller section and outputs drive signals to the PFC and DD. The drivers may comprise discrete active devices such as transistors or driver chips. A wide variety of drivers are known, which typically may be driven by a variety of logic level control signals from the controller.

The startup circuit is connected to the input voltage and responds to voltage changes in one or more other sections.

In an embodiment shown in FIG. 7, PFC 200 is connected to and supplies power to DC-DC (i.e. "LLC") Converter 300. Control module 100 has startup circuit 120 that supplies power to the controller CPU 111 inside controller 110. Controller 110 generates a drive power to the DC-DC converter 300. DC-DC converter 300 uses much power and slowly increases input voltage upon receiving power. When DC-DC converter 300 and PFC 200 both receive the drive signals to be started at the same time, a delay is experienced by the microprocessor.

The circuit combination shown in FIG. 7 alleviates this problem by sequencing the driving of the external circuits. Driver 130 ensures that earliest power is provided to controller 110 before provision to DC-DC converter 300. DC-DC converter 300 is connected to controller 110, which controls power to the DC-DC converter 300.

This circuit combination described in FIG. 7 can be configured a variety of ways, as will be understood by a skilled artisan. Preferably driver 130 and controller 110 are made in a single die and preferably PFC 200 and DC-DC converter 300 are on another die. Two or more circuits can share the same container and even the same backplane. Preferably the combination is manufactured as a single unit that is installed in or near a controlled appliance, with power valves such as MOSFET, IGBTs and the like mounted separately.

Summary of Components

PFC A wide variety of power factor control circuits are contemplated as useful for embodiments. A PFC can be as simple as a parallel capacitance but can employ a variety of inductances, capacitances and switches as will be readily apparent to a skilled electronics engineer experienced in power circuit design.

Typically for use with motorized appliances powered from an alternating current source, or with LCD drivers, one or more capacitors may be used passively or via switching. In another type an inductance or coil supplied with a rectified AC voltage is charged with an input current or discharged by a controllable switch being switched on or being switched off. The discharge current of the inductance flows via a diode to the output of the converter, said output being coupled to an output capacitance, such that a DC voltage increased relative to the input voltage can be tapped off at the output. Other types of converter can likewise be used.

The power factor correction circuits can be operated in different operating modes. In particular, operation with a continuous current through the above mentioned inductance (so-called "Continuous Conduction Mode", CCM), operation with a discontinuous inductance current or coil current ("Discontinuous Conduction Mode", DCM) or operation in the borderline or boundary range between continuous and discontinuous current through the inductance ("Borderline Conduction Mode" or "Boundary Conduction Mode," BCM) is known. In BCM operation a decrease in the coil current to zero during the discharge phase of the coil can be taken as a reason to start a new switching cycle and to switch the switch on again in order to charge the coil anew.

The power factor correction circuit can be controlled or regulated via time duration during which the switch is switched on in each case. In DCM operation, by contrast, after a zero crossing of the coil current during the discharge phase firstly there is a wait during a predefined additional waiting time until the switch is closed anew.

Details of a representative PFC can be found in U.S. No. 20150054421 filed Apr. 15, 2013 by Hans Auer, and 20150023067 filed Jul. 17, 2014 by Yoichi Terasawa of Sanken Electric Co., Ltd. The contents of the PFC shown in these documents, and in particular the circuit details are particularly incorporated by reference.

A particularly preferred PFC is shown in FIG. 8. The PFC is pointed out in the left side of this figure as section 200. The PFC shown here is controlled by control module 100.

DC to DC Converter

A wide variety of DC to DC converters are known and can be used in embodiments. Typical configurations include, for example, buck converters and boost converters. A preferred embodiment however, employs an LLC type resonant circuit for greater efficiency. "LLC" is broadly defined as a voltage conversion circuit such as a series resonance circuit or flyback converter circuit, and can be achieved by a variety of circuits, as embodiments. A wide variety of LLC circuits are useful particularly having the resonant topology that allows for zero voltage switching of the main switches, which dramatically lowers switching losses and boosts efficiency. Useful resonant converters contemplated for embodiments include, for example those taught by Keita Ishikura of Sanken Electric Co., Ltd. In U.S. No. 20130016534 published Jan. 17, 2013, the contents of which and particularly circuit details of resonant converters are specifically incorporated by reference.

Preferred are flyback converters such as that shown within region 300 of FIG. 8. A variety of flyback converters are known to skilled artisans. See for example U.S. No. 20150078036 published Mar. 19, 2015 by Milan Jovanovic, 20140233273 published Aug. 21, 2014 by Mitsutomo Yoshinaga of Sanken Electric Co., Ltd. and 20090027930 published Jan. 29, 2009 by Hiroshi Usui of Sanken Electric, Co., Ltd. The entire contents of the these records, particularly the voltage conversion circuit details are particularly incorporated by reference in their entireties.

Circuit Example

FIG. 8 shows a representative circuit. Incoming alternating voltage 310 is rectified at 301 and supplies start up power to control module 100. PFC 200 is controlled by control module 100 and supplies power to DC-DC Converter ("LLC") 300. Control module 100 switches power transistors 308, which participate in DC-DC Converter circuit 300. Flyback transformer 305 provides a rectified power to Vcc of control module 100 when active.

Start up Operation Generally

When alternating current is applied to the generalized circuit topology of FIG. 7, through a diode or diode bridge, a capacitor at PFC 200 input (not shown) becomes charged. At the same time, voltage is supplied to starting circuit 120 for CPU 111. As a result, start circuit 120 begins to operate and a capacitor (not shown) at the Vcc of Control module 100 becomes charged and the voltage at Vcc increases. When the voltage at Vcc reaches an effective turn on voltage for CPU 111, the Microprocesser begins to work.

In the absence of the advanced circuitry taught herein, because of this delay of charging, the necessary electric current grows sufficiently so that a PFC control unit and an LLC control unit portion of controller 110 can operate. However all of this extra current consumption requires a greater start and operation current, so that the Vcc capacitor must be much larger. But this causes a longer start time and requires charge up of a bigger capacitor. Further, the start of the output voltage of the LLC depends on the input voltage of the LLC, which is the output voltage of the PFC. Thus, when the PFC voltage is low, the LLC start time becomes long. Accordingly, this simple configuration has several demerits, which the preferred configuration, described next, addresses.

Improved Start Up Operation

In desirable embodiments, only a PFC control unit in the controller is started at the earlier starting time. In this context, in desirable embodiments "Control unit" indicates a microprocessor including CPU111 and SYSC112 in FIG. 7. Furthermore, the term "Control circuit" desirably includes a part of Controller 110, PWM PFC and PWM DD in FIG. 7. Still further, "Controller" indicates the "Controller" block in FIG. 7, in preferred embodiments.

A setup of PFC output voltage is performed after the PFC output voltage rises up sufficiently for a sequenced operation for exclusive use of starting operation of the LLC control unit. In an embodiment (see FIG. 7) the PFC control unit corresponds to driver PFC 131 and PWM PFC 115. In an embodiment part of the PFC control unit is in the controller and the entire PFC control unit is outside the PFC 200.

Example 1

Figure 9:
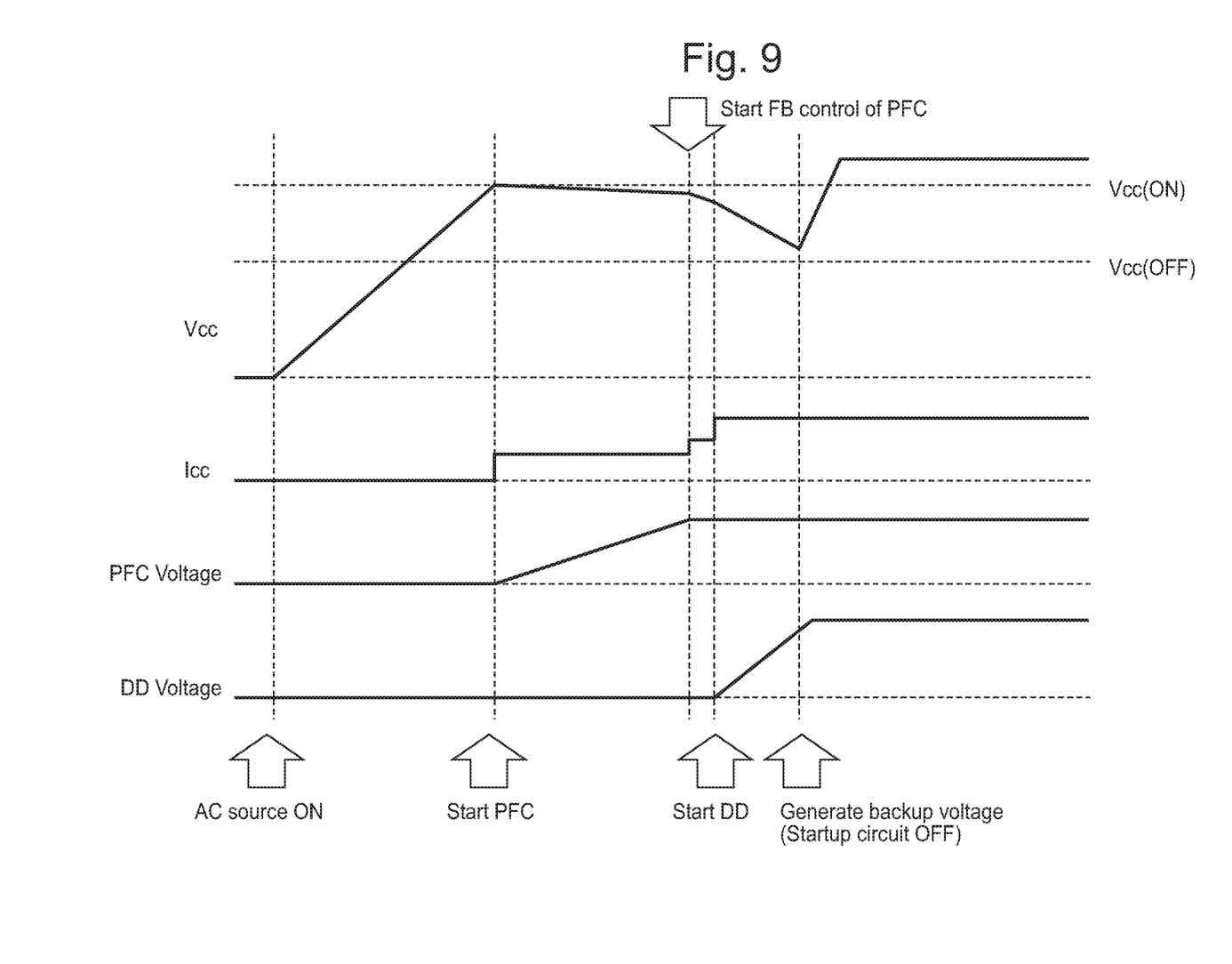
FIG. 9 is a timing sequence for a desirable power source embodiment.

As implemented in the circuit diagram of FIG. 8, FIG. 9 shows timing for a desirable start up embodiment.

As seen from the structure of FIG. 8, upon switching on, PFC output voltage increases. At first a switching element in PFC 200 is driven to a constant on duty cycle because of the voltage increase. When the PFC output voltage exceeds a target voltage, feedback control of the PFC commences. Accordingly, in the start circuit, electric current is supplied only as necessary for control of the PFC and this lowers the initial starting current demand. For example, current is supplied only for necessary conditions (Sysc) to carry out a start sequence. The term Sysc refers to a system controller that controls the sequence to boot the circuit blocks included in the controller. Thus power consumption of the control unit is reduced by limiting the electric power supply for the CPU performing system processing. Such processing may include, for example, abnormal condition detection, protection measures, communication with the outside, and data logging). This processing use of power can control the rate of Vcc voltage drop.

Furthermore, power consumption of the DSP can be minimized by assuming a constant ON duty at the beginning of PFC startup. When the PFC voltage exceeds a certain value, the feedback control of PFC starts (see FIG. 9). When the PFC voltage is stabilized by the feedback control, the LLC begins to operate. Preferably the timing of LLC operation startup is the same as the feedback control start of the PFC. Just after initiating startup of the LLC, a switching element of the LLC may be driven to a constant ON duty and the feedback may be controlled. At the same time this happens, and LLC begins to operate, backup capacitor 315 connected to the pin 3 begins to charge up. The backup capacitor corresponds to the Vcc capacitor that is connected to the Vcc terminal of the control module 100. The voltage on capacitor 315 is sensed and when sufficient voltage is confirmed a switch comprising the start up circuit is turned off. In an embodiment, this switch is included in the startup circuit and is connected between pin 1 and pin 3. When this switch is on, the Vcc capacitor is charged by the input voltage. This switch would then be turned off when the LLC begins to charge the Vcc capacitor, (backup capacitor 315).

Current thus is sequenced and supplied to the control components of the control module. At initial turn on, current is only consumed for the PFC control unit. Then later, in addition the LLC control unit operates. Accordingly initial startup current is minimized, which shortens the time before LLC output is raised up. This scheme suppresses an increase in boot-time and potentiates a startup circuit mechanism built into the microcomputer itself.

Timing Relationships of Voltages

FIG. 9 shows desirable voltage initializations among various portions of the power module. While the circuit of FIG. 8 can be used for this system result, a skilled engineer can build a variety of modifications to assert this output scheme, upon reading this specification and all such embodiments are contemplated as examples of the disclosure.

As shown in FIG. 9, upon application of alternating power "AC source ON" Vcc immediately starts increasing. In an embodiment Vcc pin 3 is connected to the input via the startup circuit and pin 1. At a certain voltage level the controller, such as control module or other microprocessor starts to work and a small Icc current is used to start the PFC. At this "Start PFC" time on the x-axis, the PFC voltage begins to rise, while the Vcc charged capacitor discharges a bit and the Vcc on the controller gradually falls. When the PFC voltage gets high enough to trigger feedback at the point "Start FB control of PFC", more Icc current is used for controller to control the PFC Voltage stabled. When the PFC voltage levels off by the feedback control, and then the LLC is started ("Start LLC" point on the x-axis). This consumes much more power but the LLC can more cleanly start. The LLC provides backup voltage to supply the control module, which then boosts up the Vcc to its normal steady state level.

Additional Configurations

Figure 10:
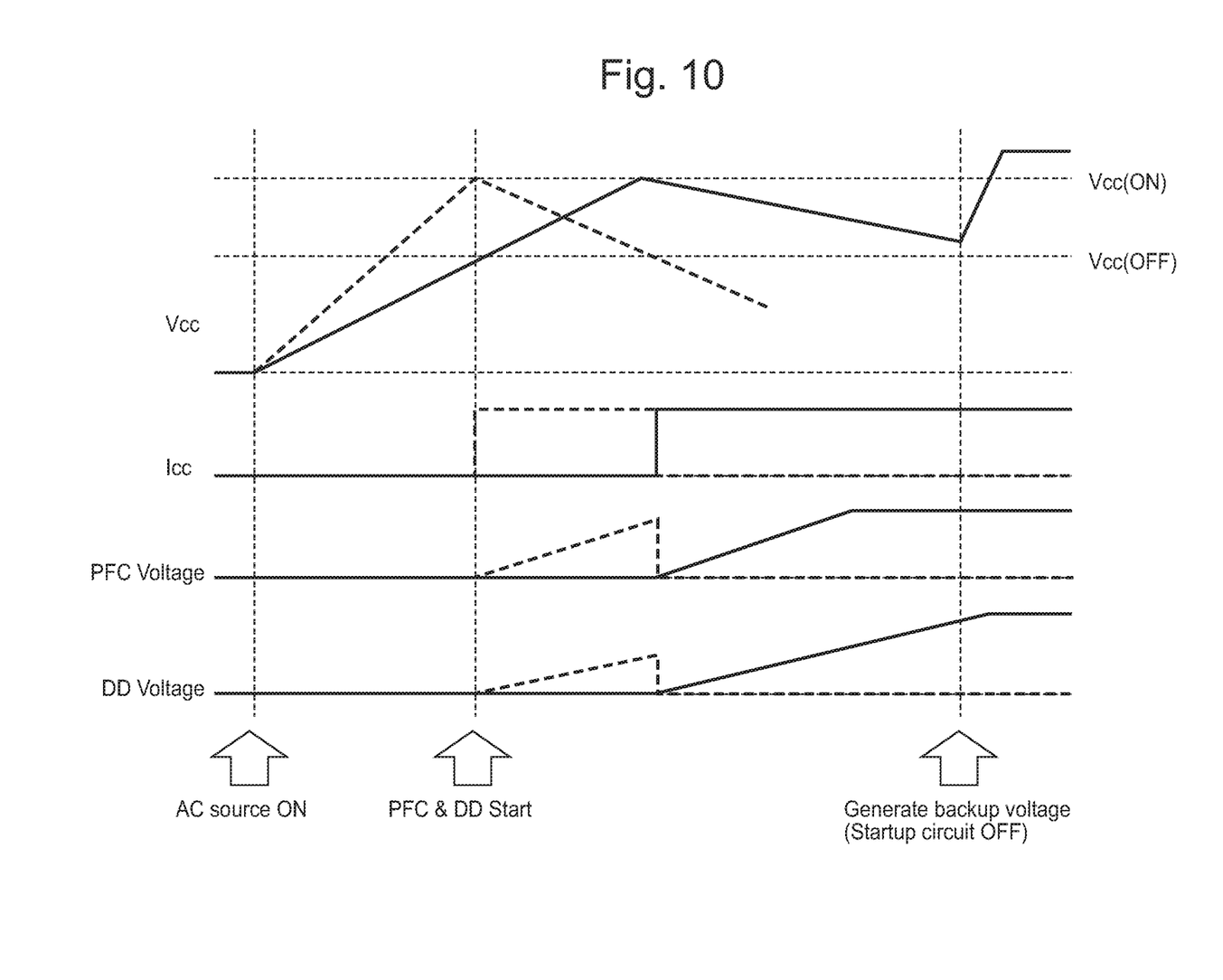
FIG. 10 is a timing sequence of an embodiment wherein PFC and LLC start together.

Variations on the scheme shown in FIG. 9 may be implemented. As shown in FIG. 10, the PFC and LLC voltages can be initially started at the same time. In one embodiment "PFC&LLC Start" at the point shown on the x-axis and Vcc falls while current is used to drive both PFC and LCC, slowly increasing their output voltages as shown in dotted lines. In an embodiment driving both PFC and LLC together causes a greater demand on the Vcc stored charge and the Vcc voltage may sharply fall below the control module minimum turn on voltage. In this case, a larger capacitor, with a longer Vcc voltage charge up time may be used to sufficiently turn on PFC and LLC at a high voltage so that the controller stays on long enough to accept backup voltage made from LLC (see point "Generate Backup voltage" on the x-axis.

Figure 11:
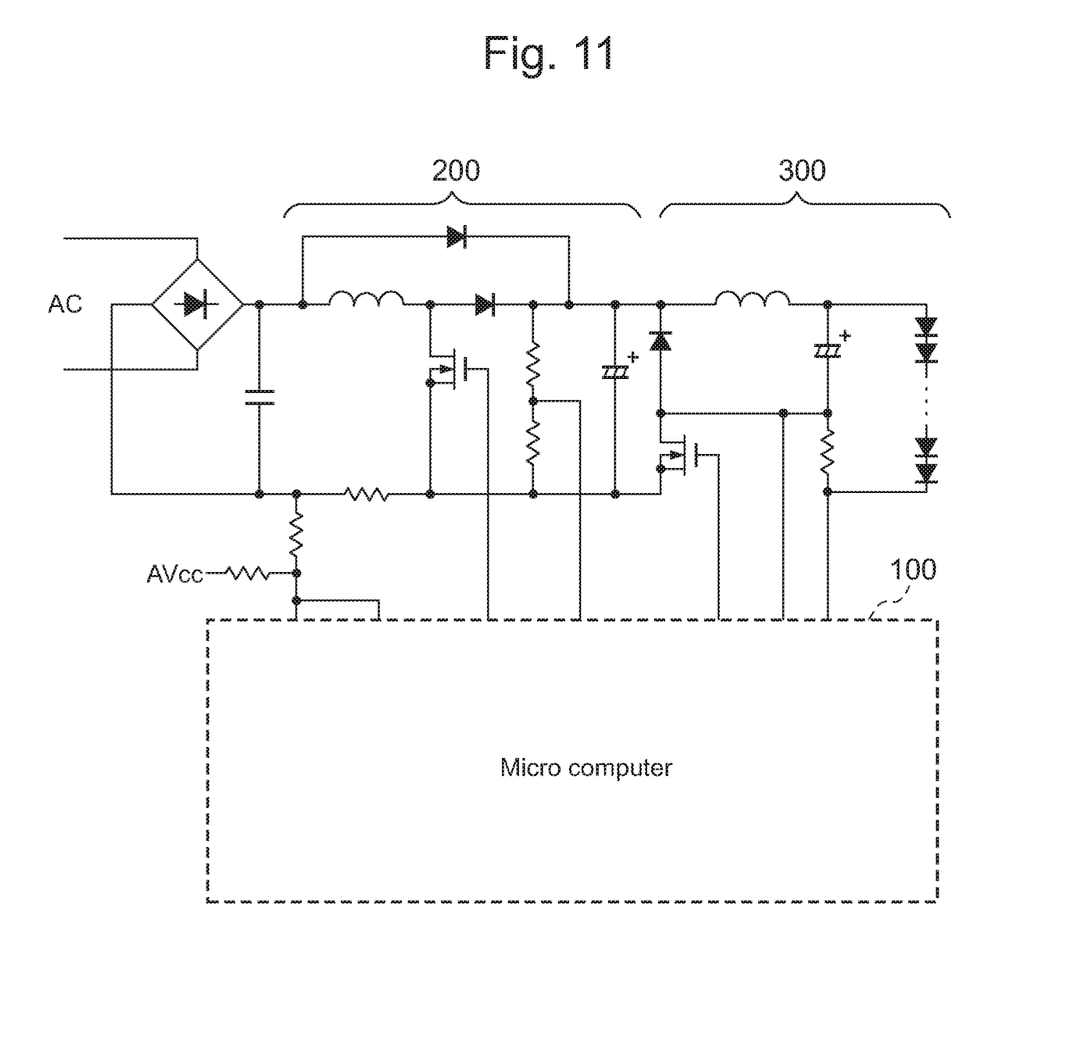
FIG. 11 is a representative circuit diagram of a power source.

FIG. 11 shows a different kind of combined PFC and DC-DC converter circuit wherein a microcomputer controls both the PFC and the DC-DC converter at the same time as shown in FIG. 10. In desirable embodiments a CPU is interfaced with various outboard components such as memory, A to D converters, PWM controllers, a UART, analog network switch, and transmitter are made on a single low voltage chip or chip set die. This desirably is interfaced with a high voltage chip, or chip set die, which has a startup regulator that outputs Vcc, other voltage regulation and outputs, low and high power transistor drive signals, PFC driver and LLC driver.

A wide variety of embodiments readily will be apprehended by a skilled artisan upon reading this specification and space limitations preclude further recitation. These and other embodiments are intended within the ambit of the following claims.

I claim:

1. A power control device, comprising:
    a first external circuit comprising at least one power valve, that converts an input voltage to an intermediate voltage;
    a second external circuit comprising at least one power valve, that converts the intermediate voltage to an output voltage;
    a control unit including a microprocessor that outputs control signals to the first and second external circuits;
    a startup circuit that generates a drive power supply voltage and provides a current to the control unit based on the drive power supply voltage, wherein the startup circuit changes the current based on a signal from the control unit, wherein
    upon application of power to the power control device, the startup circuit supplies a first current of the drive power supply voltage to the control unit while restricting supply of the first current to at least a part of the microprocessor in a first mode to start to drive the first external circuit; and then supplies a second current greater than the first current to the control unit based on the drive power supply voltage in a second mode to start to drive the second external circuit, and the control unit obtains power from the input voltage of the first external circuit and the output voltage of the second external circuit.

2. The power control device of claim 1, wherein upon application of power to the power control device, the power control device drives the first external circuit in the first mode, and then drives the second external circuit in the second mode.

3. The power control device of claim 1, wherein the control unit supplies a first control signal to the first external circuit, and then supplies a second control signal to the second external circuit.

4. The power control device of claim 1, wherein the startup circuit converts the input voltage to the drive power supply voltage and outputs power to the control unit when the drive power supply voltage is lower than a predetermined voltage, and the startup circuit stops converting from the input voltage to the drive power supply voltage when the drive power supply voltage is higher than the predetermined voltage.

5. The power control device of claim 1, comprising a first mode for supplying a first current of the drive power supply voltage to the control unit; and a second mode for supplying a second current that is greater than the first current to the control unit based on the drive power supply voltage.

6. The power control device of claim 5, wherein in the first mode, supply of the first current is restricted for at least a part of the microprocessor.

7. The power control device of claim 5 further comprising a third mode for stopping the current supplied to the control unit.

8. The power control device of claim 1, wherein the control unit obtains the drive power supply voltage based on the first and second external circuits.

9. The power control device of claim 1, further comprising a detector that detects the drive power supply voltage, and the control unit switches the current supplied to the control unit based on the detected drive power supply voltage.

10. The power control device of claim 9, wherein the detector switches the current supplied to the control unit based on outputs of the first and second external circuits.

11. The power control device of claim 10, further comprising
a timer that switches the current supplied to the control unit based on the drive power supply voltage at a predetermined time.

12. A three circuit apparatus with sequential power up capability, comprising:
a first circuit comprising
a microprocessor,
a driver with a power input and one or more outputs to a first external circuit;
a second circuit comprising the first external circuit with a power input and a power output; and
a third circuit comprising a second external circuit with a power input and a power output;
wherein upon application of external power to the three circuit apparatus,
the three circuit apparatus starts a first voltage increase at the power input of the first circuit via a temporary connection to the external power, and then
the three circuit apparatus starts a second voltage increase at the power output of the second circuit, and then
the three circuit apparatus starts a third voltage increase at the power output of the third circuit.

13. The three circuit apparatus of claim 12, wherein the first circuit comprises a startup circuit that comprises a constant current regulator and is turned off upon detection of sufficient power or voltage in the third circuit.

14. The three circuit apparatus of claim 12, wherein the second circuit power output increases in response to a sensed increase in the first circuit power or voltage input.

15. The three circuit apparatus of claim 12, wherein the third circuit power output increases in response to a sensed increase in the second circuit power or voltage input.

16. The three circuit apparatus of claim 12, wherein the microprocessor monitors the voltage of the first circuit input by repeated sampling of the voltage of the first circuit input and triggers an increase in the second circuit output in response to a sensed increase in the sampled voltage.

17. An appliance comprising the three circuit apparatus of claim 12, wherein the second external circuit provides at least part of the power to the appliance.

18. A high voltage motorized appliance comprising the three circuit apparatus of claim 12, wherein the second external circuit provides high voltage to one or more motor windings.

* * * * *